United States Patent
Homma et al.

(10) Patent No.: US 7,516,432 B2
(45) Date of Patent: *Apr. 7, 2009

(54) CIRCUIT DELAY ANALYZING METHOD, CIRCUIT DELAY ANALYZING APPARATUS, AND COMPUTER PRODUCT

(75) Inventors: Katsumi Homma, Kawasaki (JP); Toshiyuki Shibuya, Kawasaki (JP); Hidetoshi Matsuoka, Kawasaki (JP); Izumi Nitta, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 266 days.

This patent is subject to a terminal disclaimer.

(21) Appl. No.: 11/521,138

(22) Filed: Sep. 14, 2006

(65) Prior Publication Data

US 2007/0204248 A1    Aug. 30, 2007

(30) Foreign Application Priority Data

Feb. 28, 2006   (JP)   ............................. 2006-052430

(51) Int. Cl.
G06F 17/50   (2006.01)
(52) U.S. Cl. ........................................................ 716/6
(58) Field of Classification Search ................ 716/4, 716/6
See application file for complete search history.

(56) References Cited

U.S. PATENT DOCUMENTS

| | | | |
|---|---|---|---|
| 7,308,381 B2 * | 12/2007 | Yonezawa et al. | 702/179 |
| 7,320,118 B2 * | 1/2008 | Homma et al. | 716/6 |
| 7,406,672 B2 * | 7/2008 | Fukuda | 716/6 |
| 2002/0104065 A1 * | 8/2002 | Tsukiyama et al. | 716/6 |
| 2006/0150129 A1 * | 7/2006 | Chiu et al. | 716/4 |
| 2007/0033554 A1 * | 2/2007 | Tsukiyama et al. | 716/4 |
| 2007/0074138 A1 * | 3/2007 | Homma et al. | 716/6 |
| 2007/0089077 A1 * | 4/2007 | Sumikawa | 716/6 |
| 2007/0136705 A1 * | 6/2007 | Hosono | 716/6 |
| 2007/0143722 A1 * | 6/2007 | Venkateswaran et al. | 716/6 |

FOREIGN PATENT DOCUMENTS

| | | |
|---|---|---|
| JP | 07-334530 | 12/1995 |
| JP | 2004-252831 | 9/2004 |

* cited by examiner

*Primary Examiner*—Stacy A Whitmore
(74) *Attorney, Agent, or Firm*—Greer, Burns & Crain, Ltd.

(57) ABSTRACT

A delay analyzing apparatus receives a result of timing analysis of a target circuit, and detects, from paths in the target circuit, critical paths based on the result of the timing analysis with a detecting unit. A first calculating unit calculates an average delay distribution of the paths other than the critical paths based on an average delay value of each of the critical paths. A second calculating unit calculates a probability density distribution of the critical paths, and a third calculating unit calculates a probability density distribution of all of the paths based on the average delay distribution. A fourth calculating unit calculates difference between a statistical delay value of the critical paths and a statistical delay value of all of the paths based on the probability density distribution of the critical paths and the probability density distribution of all of the paths.

20 Claims, 14 Drawing Sheets

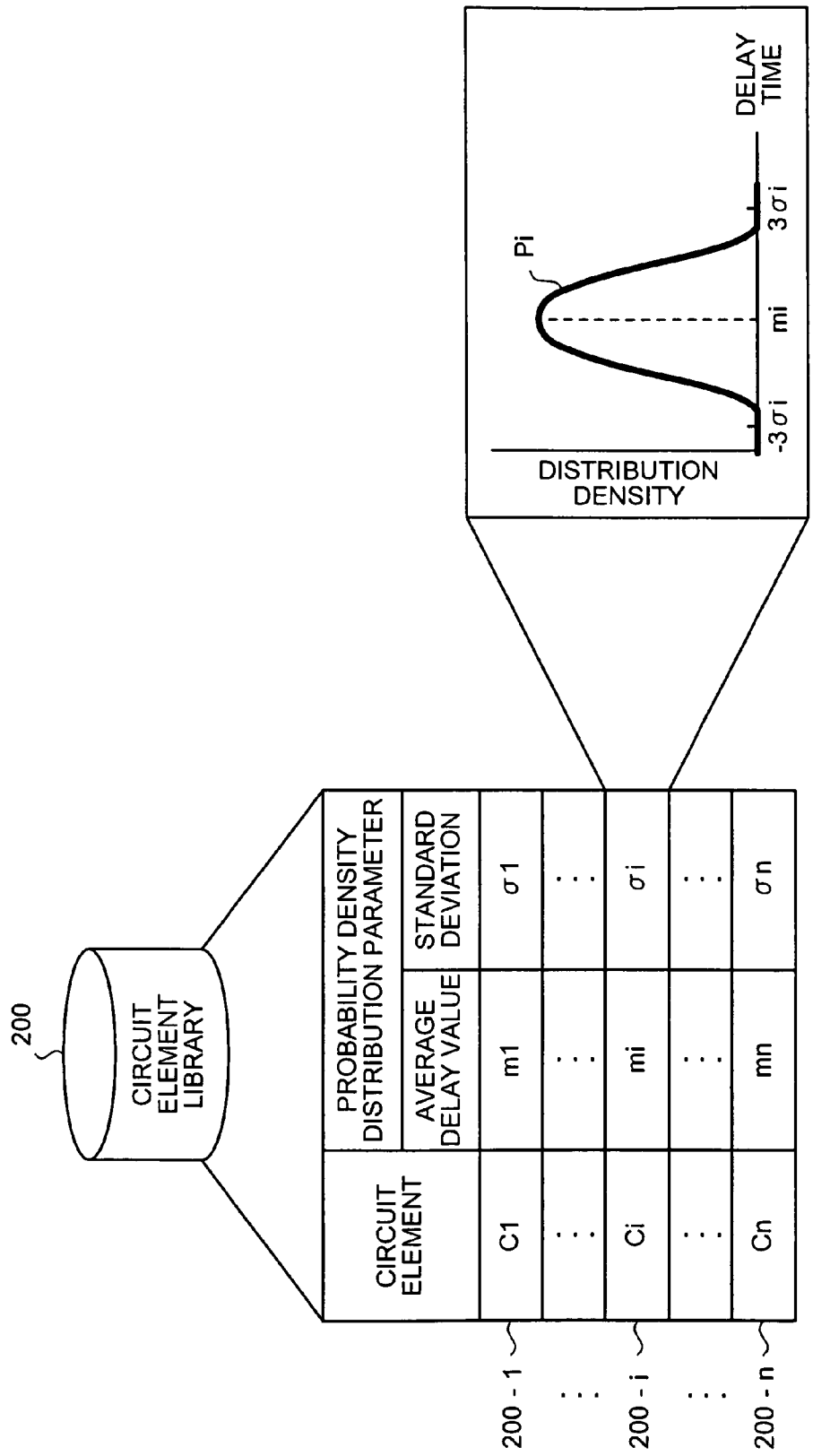

FIG.4

| CRITICAL PATH | CIRCUIT ELEMENT | AVERAGE DELAY VALUE [ps] | ACCUMULATED DELAY VALUE [ps] |
|---|---|---|---|
| CP1 | C1 | m1 | m1 |
|  | C2 | m2 | m1+m2 |
|  | C6 | m6 | m1+m2+m6 |
|  | C7 | m7 | M1 [=m1+m2+m6+m7] |
| CP2 | C8 | m8 | m8 |
|  | C2 | m2 | m8+m2 |
|  | C12 | m12 | m8+m2+m12 |
|  | C13 | m13 | M2 [=m8+m2+m12+m13] |
| CP3 | C14 | m14 | m14 |
|  | C15 | m15 | m14+m15 |
|  | C16 | m16 | m14+m15+m16 |
|  | C13 | m13 | M3 [=m14+m15+m16+m13] |
| CP4 | C17 | m17 | m17 |
|  | C18 | m18 | m17+m18 |
|  | C19 | m19 | m17+m18+m19 |
|  | C20 | m20 | M4 [=m17+m18+m19+m20] |
| ⋮ | ⋮ | ⋮ | ⋮ |
| CPx | ⋮ | ⋮ | Mx |
| ⋮ | ⋮ | ⋮ | ⋮ |
| CPz | ⋮ | ⋮ | Mz |

FIG.9
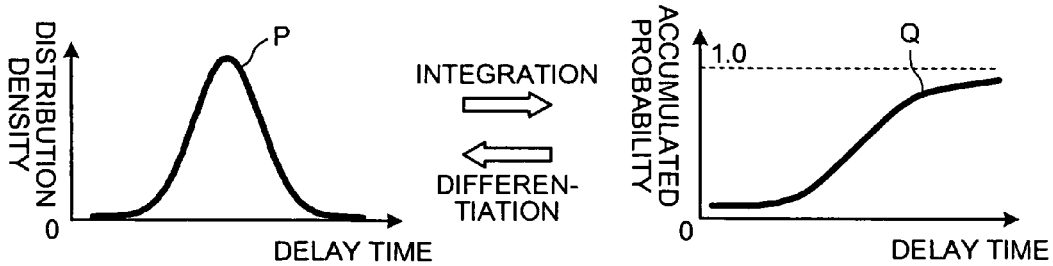
FIG.10
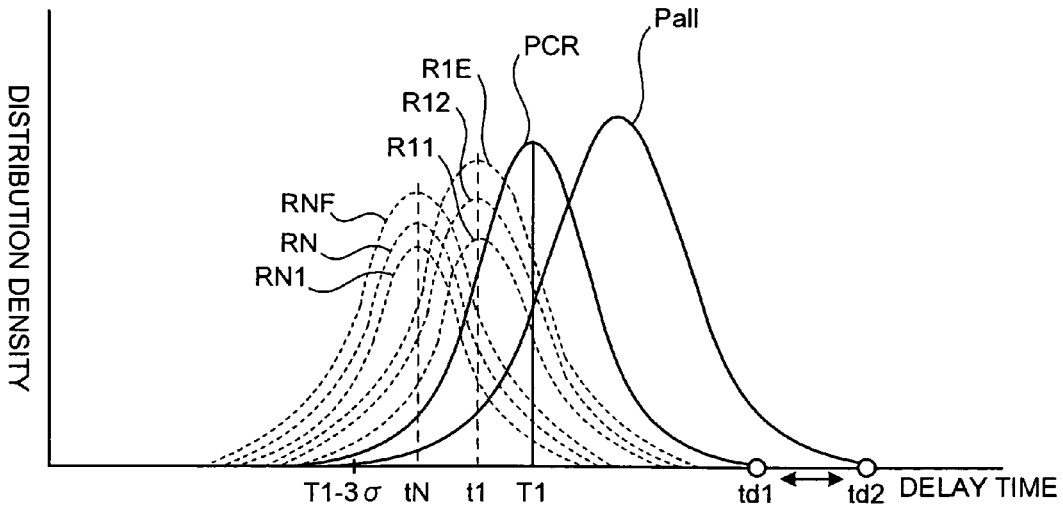
FIG.11
% STAexec STAInFile TimingList -100000
STAexec:STA EXECUTION COMMAND  STAInFile:INPUTTED FILE NAME
Timing List:OUTPUT TIMING LIST NAME  100000:NUMBER OF OUTPUT PATHS (OPTION)

CIRCUIT DELAY ANALYZING METHOD, CIRCUIT DELAY ANALYZING APPARATUS, AND COMPUTER PRODUCT

CROSS-REFERENCE TO RELATED APPLICATIONS

This application is based upon and claims the benefit of priority from the prior Japanese Patent Application No. 2006-052430, filed on Feb. 28, 2006, the entire contents of which are incorporated herein by reference.

BACKGROUND OF THE INVENTION

1. Field of the Invention

The present invention relates to a technology for analyzing a circuit delay.

2. Description of the Related Art

Recently, influence of statistical factors, such as dispersion in processing, in manufacturing of a very large scale integration (VLSI) has become stronger because the processing has become finer. Similarly, in VLSI designing, a delay improving technique in which the influence is taken into account in advance is necessary to create a circuit having a desired performance at a high yield. Conventionally, as a method of eliminating an unnecessary delay margin, taking the processing dispersion into account, a statistical delay analysis has been proposed (for example, Japanese Patent Application Laid-Open Publication No. 2004-252831). A delay minimizing apparatus that minimizes a delay of a logic circuit has also been proposed (for example, Japanese Patent Application Laid-Open Publication No. H7-334530).

However, with the conventional delay improving technique, it is difficult to accurately handle the statistical factors. For example, when the statistical factors are handled in a conventional static delay analysis (STA), a very pessimistic and incorrect circuit delay value is obtained because the estimation is executed based on the worst values of the factors. Therefore, the circuit designing is required to be redone, resulting in increase of the load on design engineers and increase of the design period.

Moreover, because the delay analysis is executed on each of all paths in a chip, the processing time required for the delay analysis is tremendous. As a result, the design period increases. Furthermore, because the above conventional technique is a technique called "partial collapsing" that reduces the circuit delay at a logic level, the circuit delay is minimized without executing the timing analyses. Therefore, a delay in a critical path is not taken into account, and an accurate circuit delay can not be obtained.

SUMMARY OF THE INVENTION

It is an object of the present invention to at least solve the above problems in the conventional technologies.

A computer-readable recording medium according to one aspect of the present invention stores therein a delay analyzing program. The delay analyzing program makes a computer execute receiving a result of timing analysis of a target circuit; detecting, from paths in the target circuit, critical paths of which a delay value is within a predetermined range based on the result of the timing analysis; calculating an average delay distribution of paths other than the critical paths based on an average delay value of each of the critical paths; calculating a probability density distribution of the critical paths based on a probability density distribution of delay of each circuit element constituting the critical paths; calculating a probability density distribution of all of the paths based on the probability density distribution of the critical paths and the average delay distribution; and calculating difference between a statistical delay value of the critical paths and a statistical delay value of all of the paths based on the probability density distribution of the critical paths and the probability density distribution of all of the paths.

A delay analyzing method according to another aspect of the present invention includes receiving a result of timing analysis of a target circuit; detecting, from paths in the target circuit, critical paths of which a delay value is within a predetermined range based on the result of the timing analysis; calculating an average delay distribution of the paths other than the critical paths based on an average delay value of each of the critical paths; calculating a probability density distribution of the critical paths based on a probability density distribution of delay of each circuit element constituting the critical paths; calculating a probability density distribution of all of the paths included in the target circuit based on the probability density distribution of the critical paths and the average delay distribution; and calculating difference between a statistical delay value of the critical paths and a statistical delay value of all of the paths based on the probability density distribution of the critical paths and the probability density distribution of all of the paths.

A delay analyzing apparatus according to still another aspect of the present invention includes a receiving unit configured to receive a result of timing analysis of a target circuit; a detecting unit configured to detect, from paths in the target circuit, critical paths of which a delay value is within a predetermined range based on the result of the timing analysis; a first calculating unit configured to calculate an average delay distribution of the paths other than the critical paths based on an average delay value of each of the critical paths; a second calculating unit configured to calculate a probability density distribution of the critical paths based on a probability density distribution of delay of each circuit element constituting the critical paths; a third calculating unit configured to calculate a probability density distribution of all of the paths included in the target circuit based on the probability density distribution of the critical paths and the average delay distribution; and a fourth calculating unit configured to calculate difference between a statistical delay value of the critical paths and a statistical delay value of all of the paths based on the probability density distribution of the critical paths and the probability density distribution of the critical paths and the probability density distribution of all of the paths.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 2 is a schematic of a circuit element library;

FIG. 4 is a schematic of a timing list;

FIG. 9 is a schematic for explaining a probability density distribution and an accumulated probability distribution of the delay;

FIG. 10 is a chart of the probability density distribution calculated from the average delay distribution shown in FIG. 7;

FIG. 11 is a schematic of an option added to an execution command of a timing analysis;

DETAILED DESCRIPTION OF THE PREFERRED EMBODIMENTS

Exemplary embodiments of the present invention will be explained in detail below with reference to the accompanying drawings.

Figure 1:
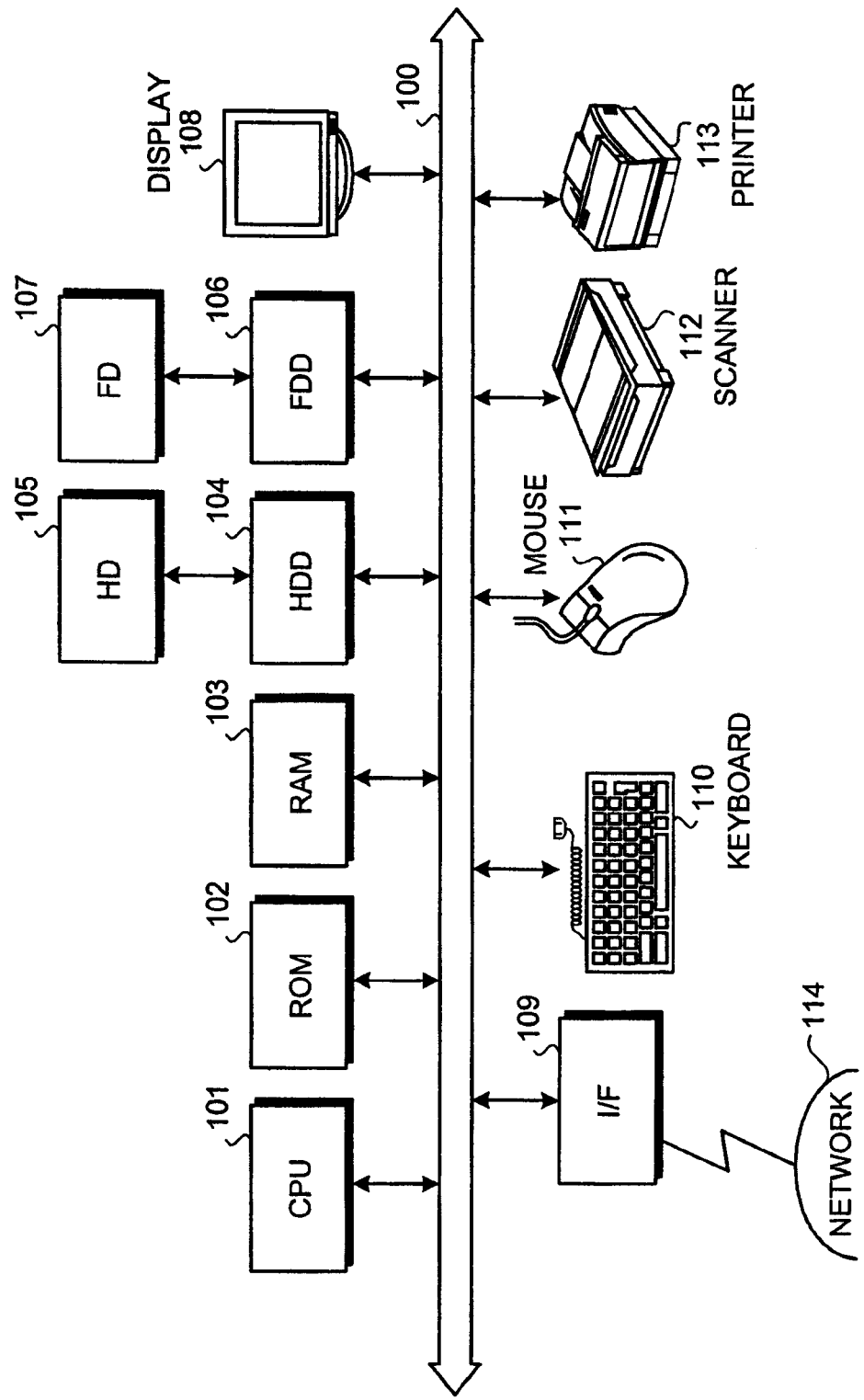
FIG. 1 is a schematic of a delay analyzing apparatus according to an embodiment of the present invention.

FIG. 1 is a schematic of a delay analyzing apparatus according to an embodiment of the present invention. As shown in FIG. 1, the delay analyzing apparatus includes a central processing unit (CPU) 101, a read-only memory (ROM) 102, a random access memory (RAM) 103, a hard disk drive (HDD) 104, a hard disk (HD) 105, a flexible disk drive (FDD) 106, a flexible disk (FD) 107 as an example of a removable recording medium, a display 108, an interface (I/F) 109, a keyboard 110, a mouse 111, a scanner 112, and a printer 113. Each component is connected via a bus 100 with each other.

The CPU 101 administers the control of the entire delay analyzing apparatus. The ROM 102 stores programs such as a boot program. The RAM 103 is used as a work area of the CPU 101. The HDD 104 controls reading/writing of data from/to the HD 105 according to the control of the CPU 101. The HD 105 stores data written according to the control of the HDD 104.

The FDD 106 controls reading/writing of data from/to the FD 107 according to the control of the CPU 101. The FD 107 stores the data written according to the control of the FDD 106, causes the delay analyzing apparatus to read the data stored in the FD 107, etc.

As a removable recording medium, in addition to the FD 107, a compact-disc read-only memory (CD-ROM), a compact-disc recordable (CD-R), a compact-disc rewritable (CD-RW), a magneto optical (MO) disk, a digital versatile disk (DVD), and a memory card may be used. In addition to a cursor, and icons or tool boxes, the display 108 displays data such as texts, images, functional information, etc. This display 108 may employ, for example, a cathode ray tube (CRT), a thin film transistor (TFT) liquid crystal display, a plasma display, etc.

The I/F 109 is connected to a network 114 such as the Internet through a communication line, and is connected to other apparatuses through the network 114. The I/F 109 administers an internal interface with the network 114 and controls input/output of data from external apparatuses. For example, a modem, a LAN adaptor, etc., may be employed as the I/F 109.

The keyboard 110 includes keys for inputting letters, digits, various instructions, etc., and executes input of data. The keyboard 110 may be a touch-panel-type input pad or a numeric key pad, etc. The mouse 111 executes move of the cursor, selection of an region, or move and size change of windows. The mouse 111 may be a track ball or a joy stick that similarly includes the function as a pointing device.

The scanner 112 optically reads images and captures image data into the delay analyzing apparatus. The scanner 112 may have an optical character recognition (OCR) function. The printer 113 prints image data and text data. For example, a laser printer or an ink jet printer may be employed as the printer 113.

FIG. 2 is a schematic of a circuit element library 200. The circuit element library 200 stores information 200-1 to 200-$n$ on delay distribution of each circuit element. The information 200-1 to 200-$n$ respectively include, for each circuit element, the name of the circuit element and probability density distribution parameters of a delay of a clock.

The probability density distribution parameters include the average delay value and the standard deviation of the circuit element. For example, a circuit element Ci has the average delay value mi and the standard deviation σi and the distribution function thereof is a probability density distribution Pi. The circuit elements can be a buffer, an inverter, a logic gate, etc.

Figure 3A:
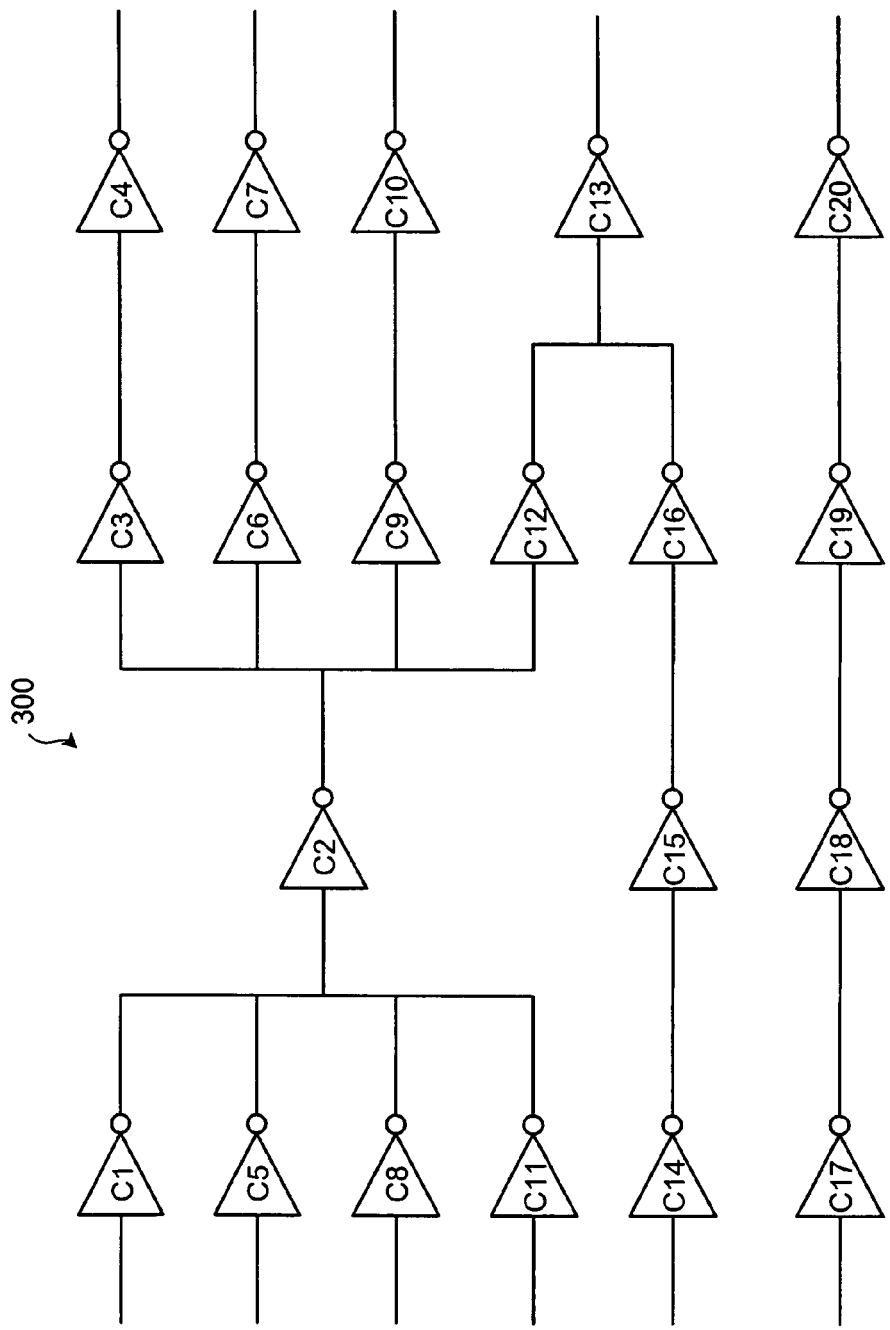
FIG. 3A is a circuit diagram of an analysis target circuit according to the embodiment.

FIG. 3A is a circuit diagram of an analysis target circuit 300 according to the embodiment. A portion of the circuit 300 is selected and shown in the figure. In FIG. 3A, the analysis target circuit 300 has circuit elements C1 to C20.

Figure 3B:
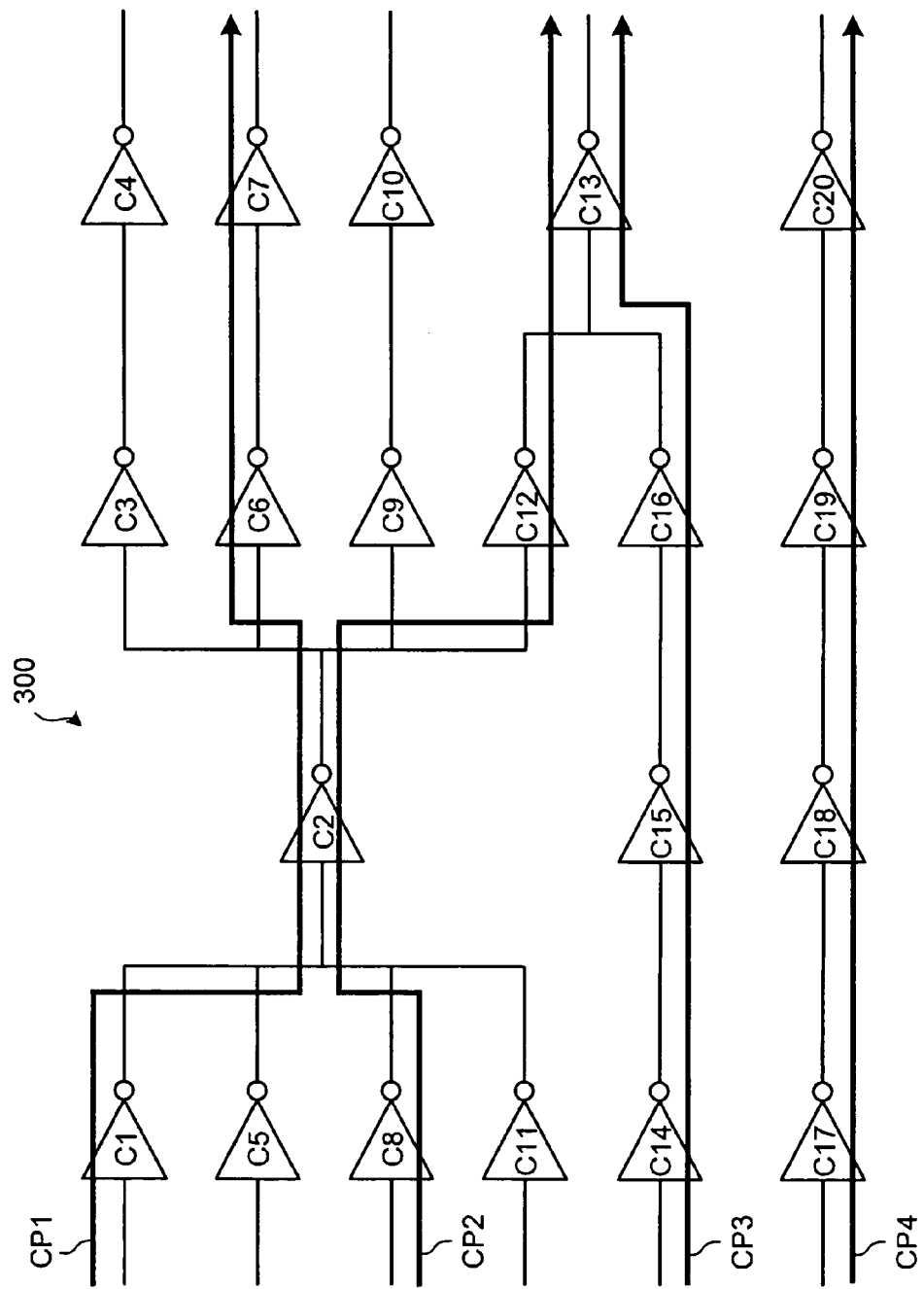
FIG. 3B is a schematic of critical paths.

Critical paths obtained from the result of a timing analysis (STA) on the analysis target circuit 300 described above will be described. FIG. 3B is a schematic of critical paths obtained from the result of a timing analysis on the analysis target circuit 300. Four critical paths CP1 to CP4 are detected from the analysis target circuit 300 as a result of the timing analysis.

The critical path CP1 is a route (path) passing through the circuit elements C1, C2, C6, and C7. The critical path CP2 is a route (path) passing through the circuit elements C8, C2, C12, and C13. The critical path CP3 is a route (path) passing through the circuit elements C14, C15, C16, and C13. The critical path CP4 is a route (path) passing through the circuit elements C17, C18, C19, and C20.

FIG. 4 is a schematic of a timing list 400 that is the result of the timing analysis according to the embodiment. The timing list 400 is obtained from the timing analysis (STA) on the analysis target circuit 300. In the timing list 400, the circuit elements constituting each of the critical paths CP1 to CPz, the average delay values of the circuit elements, and an accumulated delay value are described for each of the critical paths CP1 to CPz.

For example, the critical path CP1 is constituted of the circuit elements C1, C2, C6, and C7. In the timing analysis, the circuit element library 200 shown in FIG. 2 is used and the average delay values of the circuit elements C1, C2, C6, and C7 are respectively m1, m2, m6, and m7.

The accumulated delay value is the total of the average delay values for the circuit elements and, in the critical paths CP1 to CPz, the accumulated delay values of the circuit elements at each tail are respectively the average delay values M1 to Mz for respectively critical paths CP1 to CPz. For example, the average delay value M1 that is the total of the accumulated delay value of the critical path CP1 is the total of the delay values up to the circuit element C7 at the tail, (m1+m2+M6+m7).

Figure 5:
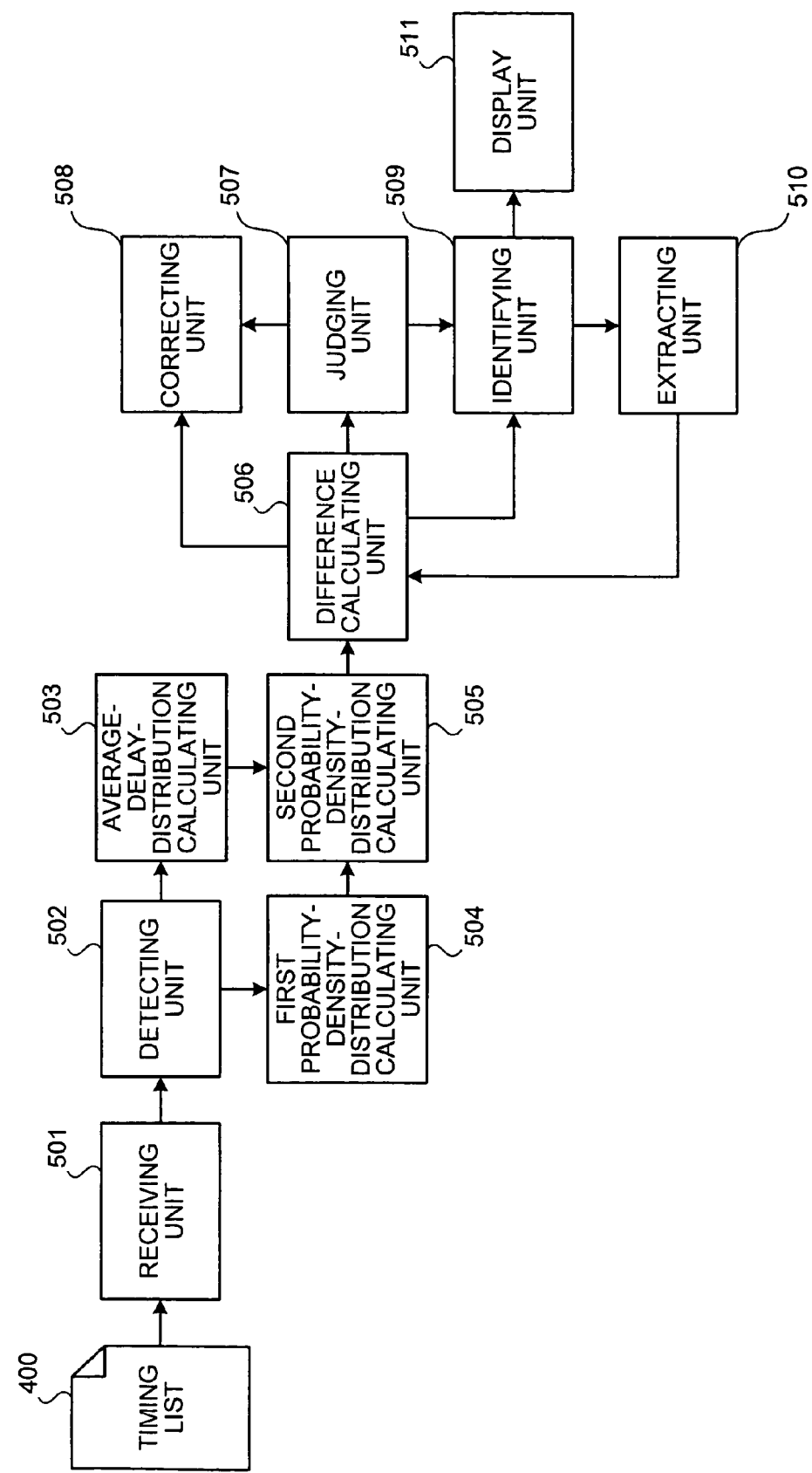
FIG. 5 is a block diagram of a delay analyzing apparatus 500 according to the embodiment.

FIG. 5 is a block diagram of the delay analyzing apparatus 500 according to the embodiment. The delay analyzing apparatus 500 includes a receiving unit 501, a detecting unit 502, an average-delay-distribution calculating unit 503, a first probability-density-distribution calculating unit 504, a second probability-density-distribution calculating unit 505, a difference calculating unit 506, a judging unit 507, a correcting unit 508, an identifying unit 509, an extracting unit 510, and a display unit 511.

The receiving unit 501 receives the timing analysis result of the analysis target circuit 300. For example, the receiving unit 501 receives the timing list 400 shown in FIG. 4. The input timing analysis result (the timing list 400) is output to the detecting unit 502.

The detecting unit 502 detects a critical path of which the delay value is within a predetermined range, from the timing analysis result received by the receiving unit 501. As the detection of a critical path, a probability density distribution is calculated of the delay of the critical path for which the delay value included in the timing analysis result is the maximum. For example, the probability density distribution is calculated for the delay of the critical path having the maximal accumulated delay value in the accumulated delay values M1 to Mz in the timing list 400.

In the timing list 400, when the accumulated delay values M1 to Mz are sorted in a descending order of the values, the accumulated delay value M1 of the critical path CP1 is the maximum, and therefore, the probability density distribution of the delay of the critical path CP1 is calculated.

Taking an example of the critical path CP1, an approach of calculating the probability density distribution will be described. When a probability density distribution is calculated, the circuit element library 200 is referred. Because the critical path CP1 includes the circuit elements C1, C2, C6, and C7, the standard deviation σ of the critical path CP1 is calculated according to Equation 1 below using the standard deviations σ1, σ2, σ6, and σ7 respectively of the circuit elements C1, C2, C6, and C7.

$$\sigma = \sqrt{\sigma 1^2 + \sigma 2^2 + \sigma 6^2 + \sigma 7^2} \quad (1)$$

Figure 6:
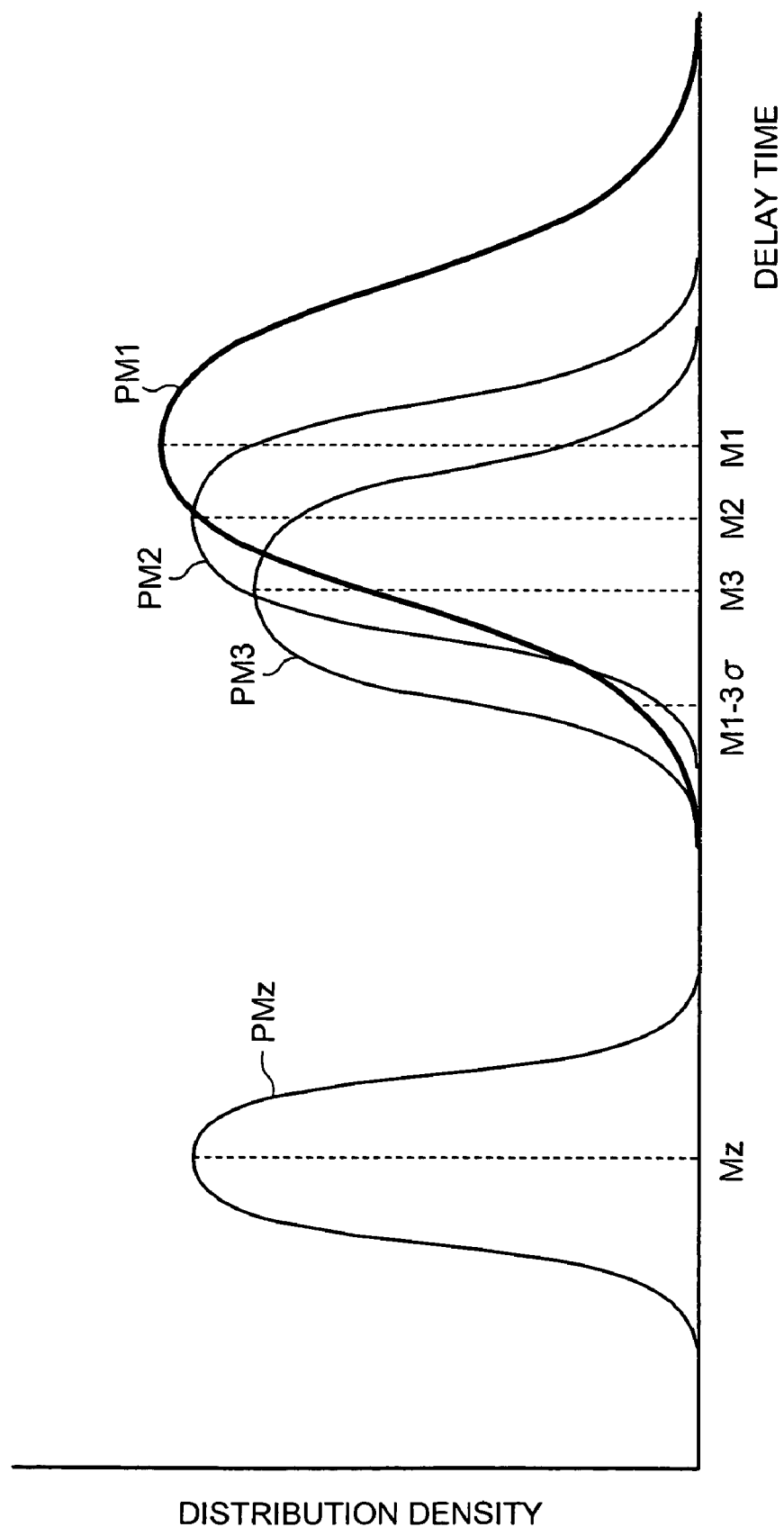
FIG. 6 is a schematic of a probability density distribution of the delay.

A probability density distribution PM1 of the delay of the critical path CP1 having the maximal accumulated delay value can be obtained using the calculated average delay value M1 and the calculated standard deviation σ. FIG. 6 is a schematic of the probability density distribution of the delay. The probability density distribution PM1 of the delay of the critical path CP1 is depicted as a Gaussian distribution having the average delay value M1 and the standard deviation σ. When the probability density distribution PM1 is calculated, a critical path having the (average) delay value within a predetermined range is detected based on the probability density distribution PM1.

For example, the critical paths CP2, CP3 are detected that respectively have accumulated delay values M2, M3 that are within a range from (M1-3σ) of the probability density distribution PM1 to the average delay value M1 shown in FIG. 6. The probability density distributions PM2, PM3 of the critical paths CP2, CP3 are shown in FIG. 6, and the probability density distribution PMz of the critical paths CPz is also shown that has the average delay value Mz that is equal to or smaller than (M1-3σ) of the probability density distribution PM1.

According to logical estimation, even though one hundred thousand critical paths are present each of which has the accumulated delay value equal to or smaller than (M1-3) of the probability density distribution PM1, the influence on the delay value of the entire analysis target circuit 300 is equal to or smaller than 1%. Therefore, it does not matter to take as the targets only the critical paths each having the average delay value thereof within the range from (M1-3σ) of the probability density distribution PM1 to the average delay value M1.

Figure 7:
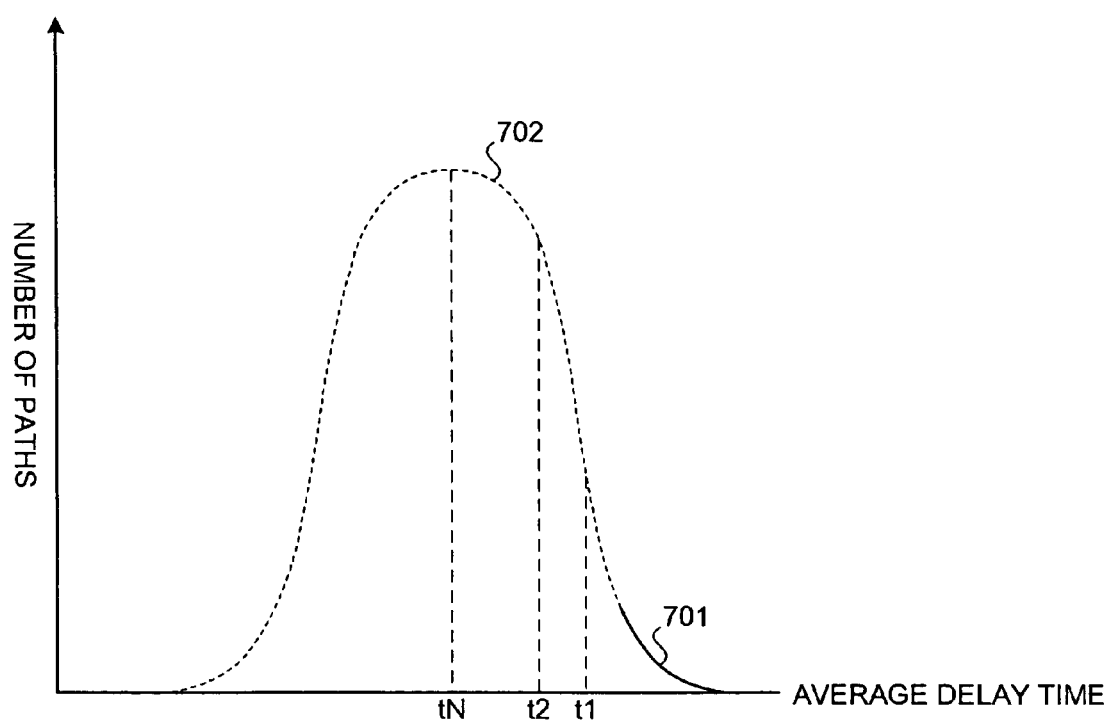
FIG. 7 is a graph of an average delay value with respect to the number of path.

The average-delay-distribution calculating unit 503 calculates the average delay distribution of paths excluding the critical paths in the analysis target circuit 300 from the average delay value of each of the critical paths detected by the detecting unit 502. FIG. 7 is a graph of the average delay value with respect to the number of path. A solid line 701 indicates the average delay distribution of critical paths. The average delay distribution can be obtained from the average delay value (accumulated delay value) of the timing list 400. A waveform 702 depicted by a dotted line is the average delay distribution of other paths excluding the critical paths in the analysis target circuit 300.

The waveform 702 can be obtained by extrapolating an approximated curve of the solid line 701. A function to which the approximated curve is extrapolated is determined. As an example of the function to which the approximated curve is extrapolated, a gamma function shown in Equation 2 below is determined.

$$f(d) = \frac{d^\alpha e^{-\beta \alpha}}{A} \quad (2)$$

In Equation 2 above, d is the average delay value and A is a function of α and β. With α and β as variables, α and β are calculated from the values on the solid line 701 using the least squares method. By substituting the calculated α and β in Equation 2, a function representing the waveform 702 (and the solid line 701) (average delay distribution) is calculated.

The first probability-density-distribution calculating unit 504 calculates the probability density distribution of critical paths based on the probability density distribution concerning the delay of each circuit element constituting the critical paths. More specifically, for example, the probability density distribution of the critical paths detected by the detecting unit 502 is calculated.

Figure 8:
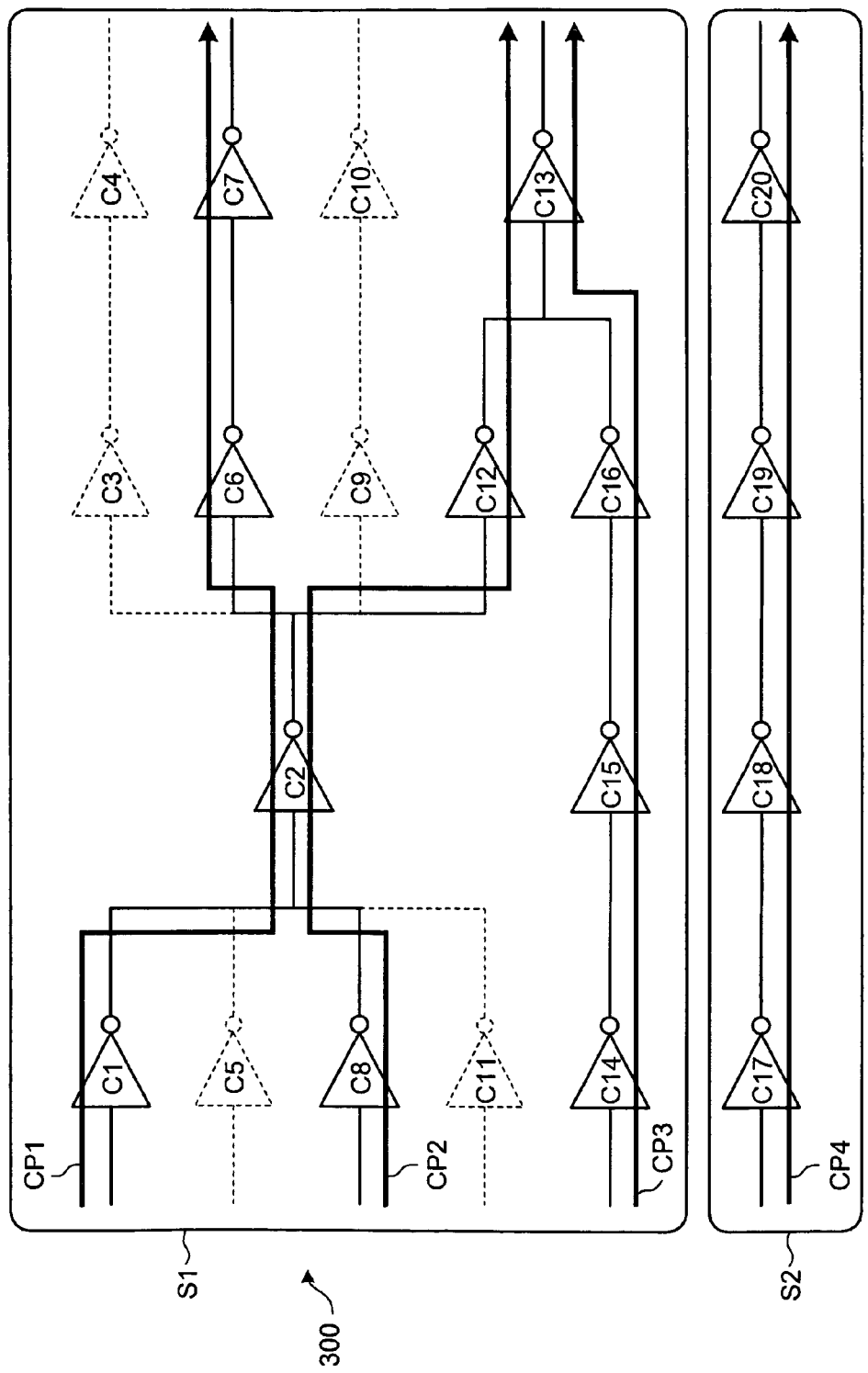
FIG. 8 is a schematic of a partial circuit according to the embodiment.

As the calculation of the probability density distribution of the critical paths, critical paths that share circuit elements constituting the analysis target circuit 300 are retrieved from the critical paths detected by the detecting unit 502, and a partial circuit constituting a portion of the analysis target circuit 300 is created. FIG. 8 is a schematic of a partial circuit according to the embodiment. As shown in FIG. 8, the analysis target circuit 300 has partial circuits S1 and S2.

Though the critical path CP1 includes the circuit elements C1, C2, C6, and C7, the critical path CP2 that shares the circuit element C2 with the critical path CP1 is retrieved. Though the retrieved critical path CP2 includes the circuit elements C8, C2, C12, and C13, the critical path CP3 that shares the circuit element C13 with the critical path CP2 is retrieved.

That is, the critical paths CP1, CP2 share the circuit element C2 with each other. Similarly, the critical paths CP2 and CP3 share the circuit element C13 with each other. Though the critical paths CP1 and CP3 have no circuit element to share with each other, a circuit constituting the critical paths CP1 to CP3 constitutes a partial circuit S1 because the critical paths CP1 and CP3 are correlated with each other through the critical path CP2. The circuit elements C3 to C5, C9 to C11 are not included in the partial circuit S1.

Though the critical path CP4 includes the circuit elements C17 to C20, the critical path CP4 as it is constitutes a partial circuit S2 because no critical path that shares the circuit elements C17 to C20 with the critical path CP4 is present.

For each of the created partial circuits, a probability density distribution of the delay of the partial circuit is calculated. FIG. 9 is a schematic for explaining the probability density distribution and the accumulated probability distribution of the delay. As shown in FIG. 9, an accumulated probability distribution Q is obtained by integrating a probability density distribution P of the delay.

Definitions of a "statistical sum (symbol: *)" and an "accumulated distribution product (symbol: ×)" will be described. For simplicity of the description, two delay distributions "a" and "b" are used in the description. A probability density distribution obtained by representing the delay distribution "a" by a probability density function is denoted by Pa. A probability density distribution obtained by representing the delay distribution "b" by a probability density function is denoted by Pb. An accumulated probability distribution obtained by representing the delay distribution "a" by an accumulated probability function is denoted by Qa. An accumulated probability distribution obtained by representing the delay distribution "b" by an accumulated probability function is denoted by Qb.

A statistical sum of the probability density distributions Pa, Pb can be expressed as Equation 3 below.

$$(Pa*Pb)(t) = \int_{-\infty}^{\infty} dx Pa(t-x) \cdot Pb(x) \quad (3)$$

A statistical sum of the accumulated probability distributions Qa, Qb can be described in Equation (4) below.

$$(Qa*Qb)(t) = \int_{-\infty}^{\infty} dx Qa(t-x) \cdot Pb(x) \quad (4)$$

The accumulated distribution product of the probability density distributions Pa and Pb can be expressed as Equation 5 below.

$$(Pa \times Pb)(t) = Pa(t) \cdot Qb(t) + Pb(t) \cdot Qa(t) \quad (5)$$

The accumulated distribution product of the accumulated probability distributions Qa and Qb can be described in Equation (6) below.

$$(Qa \times Qb)(t) = Qa(t) \cdot Qb(t) \quad (6)$$

As calculation of the probability density distribution, the probability density distribution concerning the delay of each circuit element in a partial circuit is calculated. For a portion including circuit elements connected in series, the probability density distribution concerning the delay of the portion having the connection in series is calculated by calculating the statistical sum of the probability density distribution concerning the delay of the circuit elements (Equation 3 above). For a portion including circuit elements connected in parallel, the accumulated distribution product of the portion is calculated by calculating the accumulated distribution product of the probability density distribution concerning the delay of the circuit elements (Equation 5 above).

Using the partial circuit S1 described above, an approach of calculating will be described for the accumulated probability distribution concerning the delay of the partial circuit S1 when the partial circuit S1 includes the shared circuit elements. The partial circuit S1 has the circuit element C2 shared by the critical paths CP1, CP2 and the circuit element C13 shared by the critical paths CP2, CP3.

Therefore, focusing on the circuit elements C1, C2, and C8, the circuit elements C1, C8 are connected in parallel. Therefore, the accumulated probability distribution can be described using Equation 3 and Equation 5 above (Equation 7 below). P1 is the probability density distribution concerning the delay of the circuit element C1. P2 is the probability density distribution concerning the delay of the circuit element C2. P8 is the probability density distribution concerning the delay of the circuit element C8.

$$(P1 \times P8)*P2 \quad (7)$$

Focusing on the circuit elements C14 to C16, the circuit elements C14 to C16 are connected in parallel. Therefore, the accumulated probability distribution can be expressed as Equation 3 above (Equation 8 below). P14 is the probability density distribution concerning the delay of the circuit element C14. P15 is the probability density distribution concerning the delay of the circuit element C15. P16 is the probability density distribution concerning the delay of the circuit element C16.

$$P14*P15*P16 \quad (8)$$

From such a relation, a probability density distribution PS1 concerning the delay of the partial circuit S1 can be described in Equation 9 below. P1, P2, P6 to P8, and P12 to P16 are respectively the probability density distributions concerning the delay of the circuit elements C1, C2, C6 to C8, and C12 to C16.

$$(P1 \times P8) = P2*(P14*P15*P16) \times P12 \times (P6*P7)*P13 \quad (9)$$

According to Equation 8 above, an accumulated distribution product can be taken for the probability density distributions of the circuit elements around the circuit elements C2, C13 that are shared. Therefore, the calculation process can be simplified. Thus, increase of the calculation speed can be facilitated.

Because the probability density distribution PS2 concerning the delay of the partial circuit S2 has no circuit element that is shared, the probability density distribution PS2 can be expressed as Equation 10 below. P17 to P20 are accumulated probability distributions respectively concerning the delay of the circuit elements C17 to C20.

$$PS2 = P17*P18*P19*P20 \quad (10)$$

The probability density distribution P concerning the analysis target circuit 300 can be expressed as Equation 11 below according to Equation 5 above using the probability density distribution PS1 concerning the delay of the partial circuit S1 and the probability density distribution PS2 of the delay of the partial circuit S2.

$$P = PS1 \times PS2 \quad (11)$$

The second probability-density-distribution calculating unit 505 calculates a probability density distribution of all the paths included in the analysis target circuit 300 based on the probability density distributions of the critical paths calculated by the first probability-density-distribution calculating unit 504 and the average delay distribution calculated by the average-delay-distribution calculating unit 503.

For example, the unit 505 calculates a probability distribution density of each of other paths excluding the critical paths in the analysis target circuit 300 from the average delay distribution calculated by the average-delay-distribution calculating unit 503. Using Equation 5 above, the unit 505 calculates the probability distribution density of all the paths in the analysis target circuit 300 from an accumulated distribution product of the probability density distribution of each of the other paths calculated and the probability density distributions of the critical paths.

An approach of calculating the probability density distribution of each of the other paths from the average delay distribution shown in FIG. 7 will be described. As described in FIG. 6, the probability density distribution can be represented by the average delay value and the standard deviation. The average delay values (t1, t2, ..., tN) can be obtained from the waveform 702 of FIG. 7. For example, the standard deviation of a critical path with which the average delay value of the critical path becomes the minimum may be the standard deviation of each of the average delay values (t1, t2, ..., tN).

For example, when the average delay value of a critical path CPx is the minimum, the standard deviation of the critical path CPx is the standard deviation of each of the average delay values (t1, t2, ..., tN). When a plurality of critical paths having the average delay values that are the minimum are present, the maximal standard deviation in those of the critical paths is the standard deviation of each of the average delay values (t1, t2, tN).

For example, the standard deviation may be a value obtained by multiplying each of the average delay values (t1, t2, ..., tN) calculated from the average delay distribution by a predetermined value (for example, 0.05). The predetermined value is generally a value smaller than 1. Using the average delay value and the standard deviation calculated according to the process described above, the probability density distribution of each of the other paths can be calculated.

FIG. 10 is a chart of the probability density distribution calculated from the average delay distribution shown in FIG. 7. The probability density distribution of the average delay values t1 and tN are shown in FIG. 7. Waveforms R11, R12, and R1E indicate the probability density distribution of the average delay value t1.

Waveforms RN1, RN2, and RNF indicate the probability density distribution of the average delay value tN. "E" and "F" are respectively the numbers of paths respectively having the average delay values t1 and tN thereof and can be read from the values on the axis of ordinate of the graph of the average delay distribution shown in FIG. 7. A waveform PCR is the probability density distribution of the critical paths calculated according to Equation 10 above.

As calculation of the probability density distribution of all the paths, an accumulated distribution product PR1 of the probability density distribution PCR and the probability density distribution R11 of the critical paths is calculated using Equation 5 above. An accumulated distribution product PR2 of the calculated PR1 and the probability density distribution R12 is calculated. A similar process is executed to each of all the probability density distributions of the average delay value t1.

The similar process is further executed to each of the probability density distributions of the average delay values t2, t3, ..., tN. Thus, the probability density distributions of all the paths in the analysis target circuit 300 are calculated. The probability density distribution of all the paths calculated according to the process described above is indicated by a waveform Pa11.

The difference calculating unit 506 calculates the difference between the statistical delay value of the critical paths and the statistical delay value of all the paths based on the probability density distribution of the critical paths and the probability density distribution of all the paths calculated by the second probability-density-distribution calculating unit 505. For example, a statistical delay value td1 is calculated from the probability density distribution PCR of the critical paths shown in FIG. 10. A statistical delay value td2 is calculated from the probability density distribution Pa11 of all the paths.

As to the statistical delay value td1 (td2), representing, for example, the average delay value in the probability density distribution as "m" and the standard deviation as "σ", the statistical delay values of m+3σ (99.86%) are respectively td1 and td2 shown in FIG. 10. The difference between the statistical delay values (td2−td1) is the difference (reliability). More specifically, the difference (reliability) is the reliability of the statistical delay value calculated from the critical paths. As this value becomes smaller, this value can be said to be a more accurate statistical delay value.

The difference calculating unit 506 calculates the difference between the statistical delay value of the critical paths and the statistical delay value of a valid path based on the probability density distribution of the critical paths and a probability density distribution of a valid path extracted by the extracting unit 510. This process will be described later.

The judging unit 507 judges whether the difference calculated by the difference calculating unit 506 is equal to or smaller than a predetermined value. The predetermined value may be input in advance into the delay analyzing apparatus 500 or may be input by a user every time the difference is calculated.

The correcting unit 508 corrects the statistical delay value of the critical paths using the difference calculated by the difference calculating unit 506 when the difference is judged by the judging unit 507 not to be equal to or smaller than the predetermined value. More specifically, for example, when the difference is larger than the predetermined value, the difference is added to the statistical delay value of the critical paths. Thus, a more accurate statistical delay value of the analysis target circuit 300 can be obtained.

When the difference is judged not to be equal to or smaller than the predetermined value, the identifying unit 509 identifies paths (hereinafter, "valid paths") of which the average delay value is equal to or larger than a reference value that defines the validity of the average delay value in other paths based on the average delay distribution of other paths and the probability density distribution of the critical paths.

For example, representing the maximal average delay value as T1 in the average delay values of the probability density distribution of the critical paths and the probability density distribution of other paths, T1-3σ is the reference value. The paths having the average delay value thereof equal to or larger than the reference value are identified. More specifically, for example, the number of identified paths is the number of paths each having the average delay value within the range from (T1-3σ) to the average delay value T1, shown in FIG. 10. For example, the number of the identified valid paths can be added as an option to execution commands used when a timing analysis is executed.

By adding the option in this manner, when the statistical delay value is again calculated, the statistical delay value can be calculated excluding the probability density distributions of paths that do not influence on the delay of the analysis target circuit 300. Thus, the precision of the calculated statistical delay value is improved.

FIG. 11 is a schematic of the option added to an execution command of a timing analysis. "STAexec" shown in FIG. 11 is an execution command to execute the timing analysis. "STAInFile" is a file name input when the timing analysis is executed, and more specifically is a file name of the circuit element library shown in FIG. 2.

"TimingList" is the name of a file showing the analysis result of the timing analysis, and more specifically is, for example, a file name of the timing list shown in FIG. 4. "−100000" is information added as an option to the execution command of the timing analysis, and more specifically is, for example, the number of paths used to calculate the statistical delay values.

The extracting unit 510 extracts the probability density distribution of the valid paths identified by the identifying unit 509 from the probability density distributions of all the paths, and more specifically, for example, extracts the probability density distribution having the average delay value within the range from (T1-3σ) to the average delay value T1 shown in FIG. 10.

For example, when the number of output paths, "−100000" is described as information added to the STA execution command descried above, the probability density distributions of the valid paths corresponding to a hundred thousand valid paths are extracted from the probability density distribution of other paths. In this manner, by adding an option to the execution command, a delay analysis can be executed using a previous analysis result when the delay analysis is executed again.

The extracted probability density distributions of the valid paths are output to the difference calculating unit 506. The difference is calculated between the statistical delay value of the critical paths and the statistical delay value of the valid paths based on the probability density distribution of the valid paths and the probability density distribution of the critical paths.

More specifically, using Equation 5 above, the probability distribution density of the analysis target circuit 300 is calculated from the accumulated distribution product of the probability density distribution of each of the valid paths extracted and the probability density distribution of the critical paths. The statistical delay value of the analysis target circuit 300 and the statistic delay value of the critical paths are calculated and the difference therebetween is calculated. Description of the calculating process of the probability density distribution of the analysis target circuit 300 is omitted because the description overlaps the contents above.

The display unit 511 displays on a display screen information concerning paths having the average delay value thereof equal to or larger than the reference value that defines the validity of the average delay value in the other paths based on the average delay distributions of the other paths and the probability density distribution of the critical paths. For example, the display unit 511 displays on the display screen the number of valid paths identified by the identifying unit 509, the value of the delay value of the valid path having the maximal or the minimal delay value, the value of the reference value, etc.

The receiving unit 501, the detecting unit 502, the average-delay-distribution calculating unit 503, the first probability-density-distribution calculating unit 504, the second probability-density-distribution calculating unit 505, the difference calculating unit 506, the judging unit 507, the correcting unit 508, the identifying unit 509, the extracting unit 510, and the display unit 511, described above, realize the functions thereof by the CPU 101 executing a program recorded in a recording medium, such as the ROM 102, the RAM 103, the HD 105, and the FD 107 shown in FIG. 1.

Figure 12:
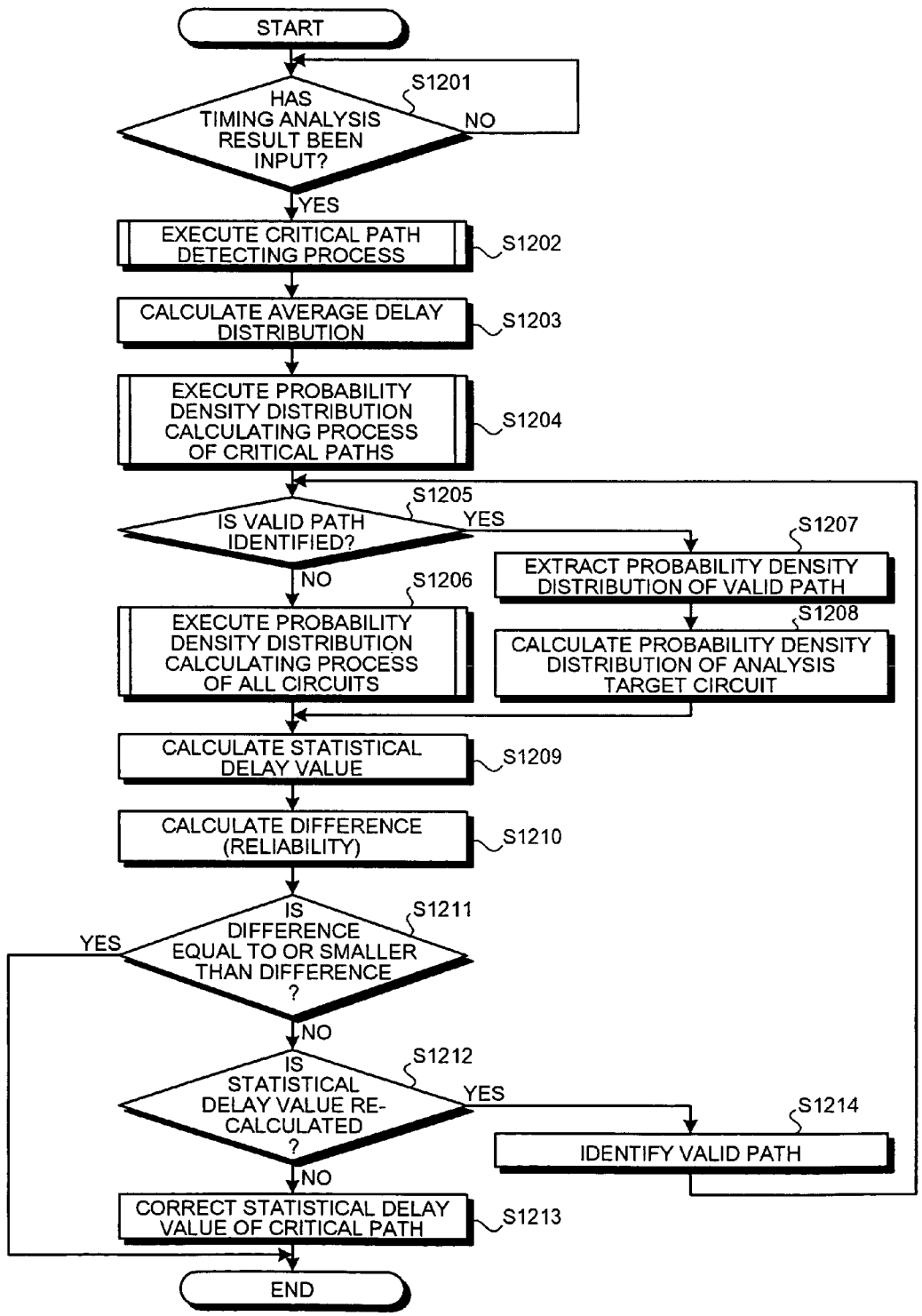
FIG. 12 is a flowchart of a delay analyzing process by the delay analyzing apparatus 500.

FIG. 12 is a flowchart of a delay analyzing process by the delay analyzing apparatus 500 according to the embodiment. The receiving unit 501 waits for an input of the result of the timing analysis (step S1201: NO). When the result of the timing analysis is input (step S1201: YES), a critical path detecting process is executed (step S1202). The average delay distribution of all the paths in the analysis target circuit 300 is calculated by the average-delay-distribution calculating unit 503 from the average delay distribution of the critical paths (step S1203).

A probability density distribution calculating process is executed by the first probability-density-distribution calculating unit 504 for the critical paths (step S1204). Whether any valid paths are identified is judged (step S1205). When no valid path is identified (step S1205: NO), the probability density distribution calculating process is executed by the second probability-density-distribution calculating unit 505 for each of all the paths in the analysis target circuit 300 (step S1206). The procedure is advanced to step S1209.

When valid paths are identified (step S1205: YES), the probability density distribution of each of the valid path is extracted (step S1207). Using the extracted probability density distributions, the probability density distribution of the analysis target circuit is calculated (step S1208). The statistical delay values of the critical paths and all the paths in the analysis target circuit 300 are separately calculated (step S1209). The difference (reliability) between the calculated statistical delay values is calculated (step S1210).

The judging unit 507 judges whether the difference is equal to or smaller than the predetermined value (step S1211). When the difference is equal to or smaller than the predetermined value (step S1211: YES), the series of processes are ended. When the difference is not equal to or smaller than the predetermined value (step S1211: NO), the judging unit 507 judges whether the statistical delay value of the critical paths is calculated again based on the calculated difference (step S1212). The judgment of whether to calculate the statistical delay value again is judged according to an input from the user. The calculated difference is displayed on the display unit 511, and referring to the value displayed on the display unit 511, the user can judge whether to calculate the statistical delay value again.

When the statistical delay value is calculated again (step S1212: YES), the identifying unit 509 identifies the valid paths (step S1214). Returning to step S1205, whether the valid paths are identified is judged. When the statistical delay value is not calculated again at step S1212 (step S1212: NO), the statistical delay value of the critical paths is corrected (step S1213). Thus, the series of processes are ended.

Figure 13:
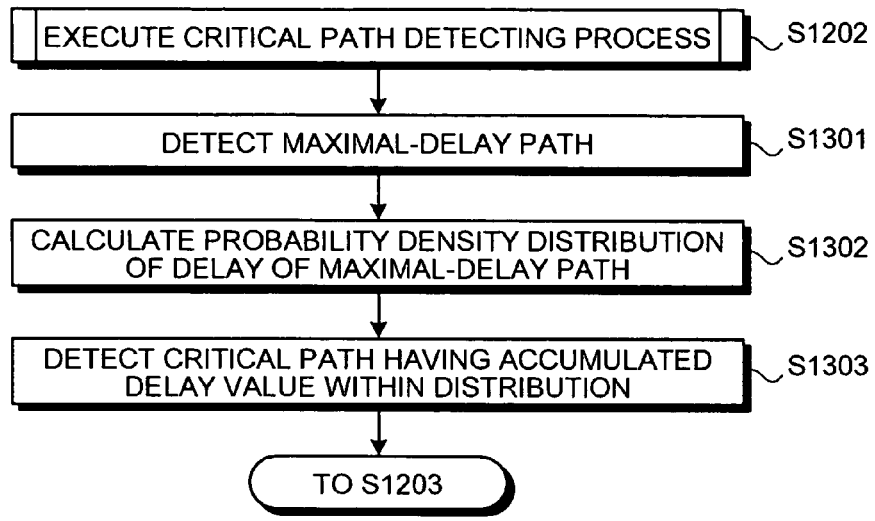
FIG. 13 is a flowchart of a critical path detecting process.

FIG. 13 is a flowchart of a critical path detecting process. The detecting unit 502 first detects the critical path having the maximal accumulated delay value (maximal-delay path) (step S1301). The probability density distribution concerning the delay of the maximal-delay path is calculated (step S1302). Critical paths (x paths) having the accumulated delay value within the probability density distribution are detected (step S1303). The procedure is advanced to step S1203 shown in FIG. 12.

Figure 14:
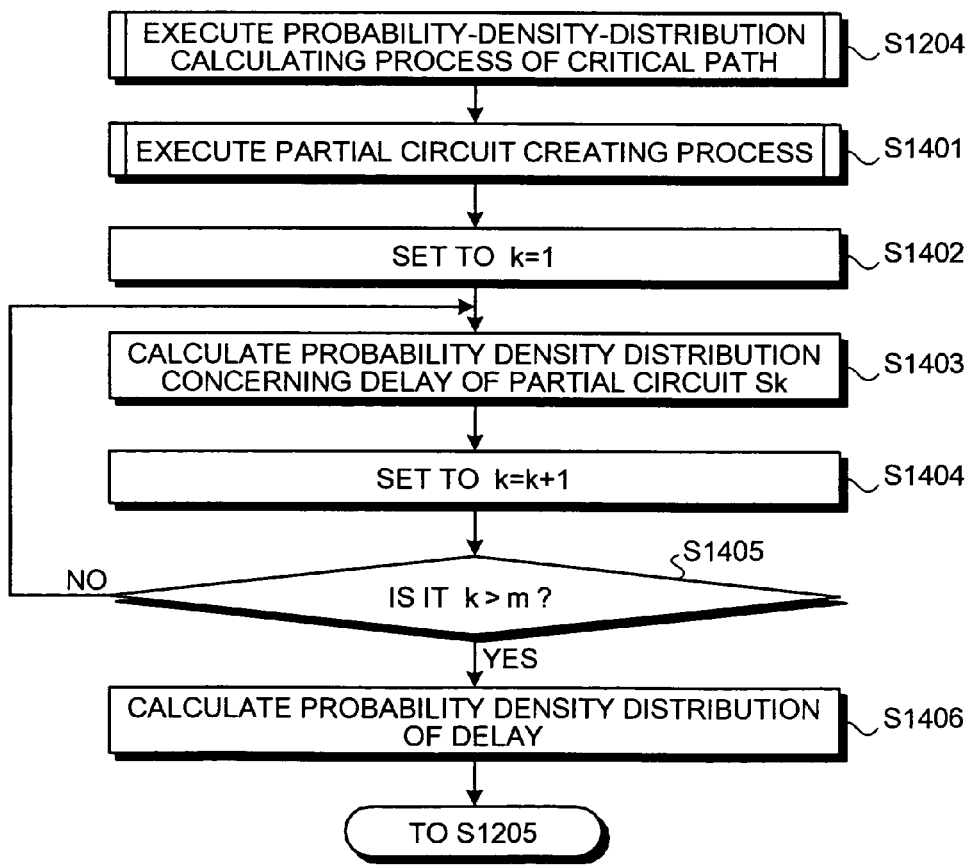
FIG. 14 is a flowchart of a probability density distribution calculating process for the critical paths.

FIG. 14 is a flowchart of a probability density distribution calculating process by the critical paths. The probability density distribution calculating unit 504 executes a partial circuit creating process (step S1401). Setting k=1 (step S1402), the probability density distribution concerning the delay of a partial circuit Sk is calculated (step S1403).

Incrementing k (step S1404), whether it is k>m is judged (step S1405) where m is the total number of the partial circuits Sk. When k is not k>m (step S1405: NO), returning to step S1403, the accumulated probability distribution concerning the delay of the partial circuit Sk is calculated. When k>m (step S1405: YES), the probability density distribution concerning the delay of the analysis target circuit 300 is calculated (step S1406). The procedure is advanced to step S1205 shown in FIG. 12.

Figure 15:
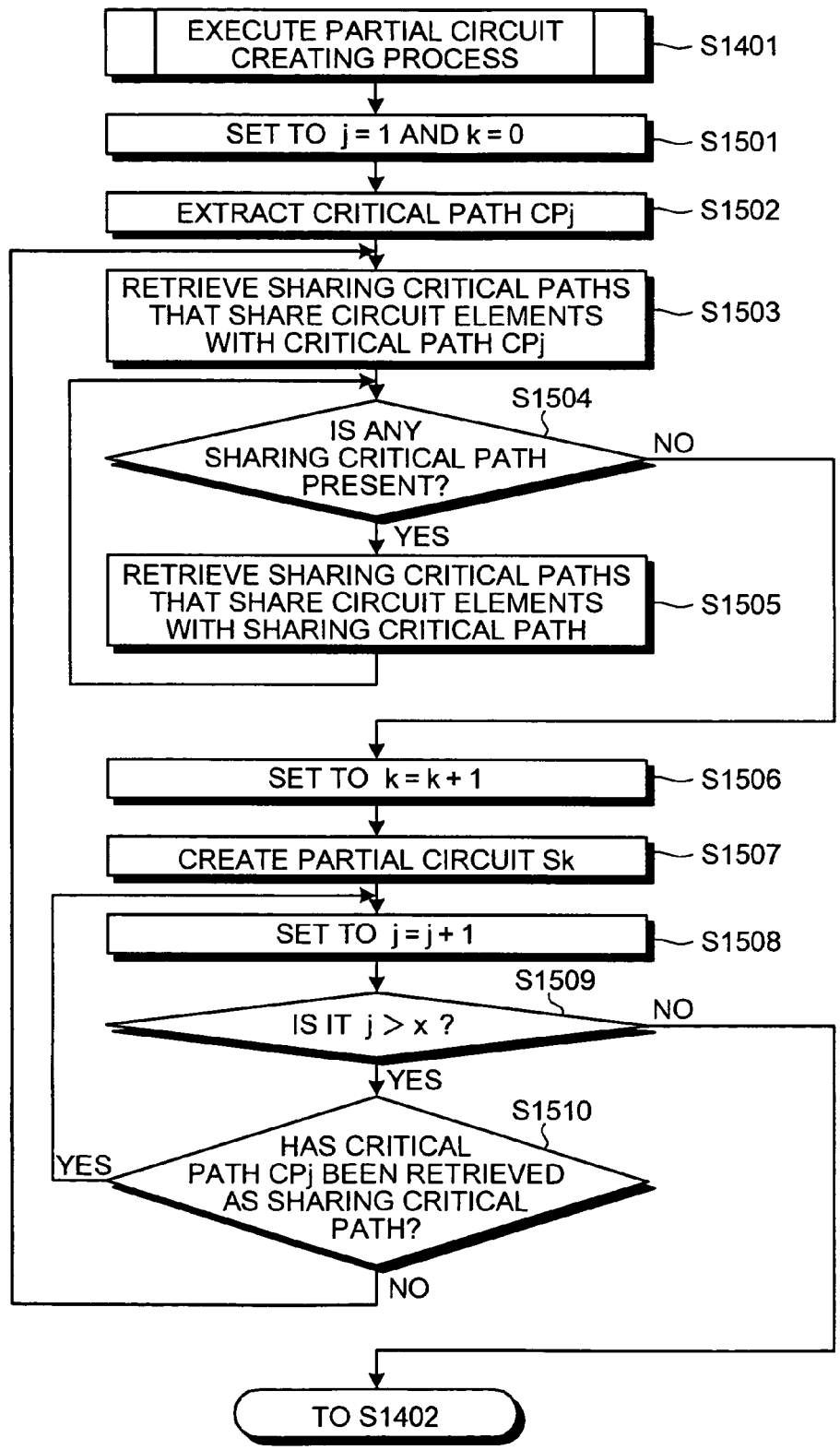
FIG. 15 is a flowchart of a partial circuit creating process.

FIG. 15 is a flowchart of the partial circuit creating process. Setting j=1 and k=0 (step S1501), a critical path CPj is extracted from the x critical paths detected by the detecting unit 502 (step S1502). Critical paths (sharing critical paths) that share circuit elements with a critical path CPj are retrieved (step S1503).

When the sharing critical paths are retrieved (step S1504: YES), critical paths (sharing critical paths) that share circuit elements with the retrieved sharing critical path are retrieved (step S1505). The procedure is returned to step S1504. When no sharing critical paths are retrieved (step S1504: NO), k is incremented (step S1506) and a partial circuit Sk is created (step S1507). The partial circuit Sk is a circuit that consists of circuit elements constituting the critical path CPj and circuit elements constituting the sharing critical paths.

Incrementing j (step S1508), whether it is j>x is judged (step S1509). When it is j>x (step S1509: YES), whether the critical path CPj is retrieved as a sharing critical path is judged (step S1510). When the critical path CPj is retrieved as a sharing critical path (step S1510: YES), returning to step S1508, j is further incremented.

When the critical path CPj is not retrieved as a sharing critical path (step S1510: NO), returning to step S1503, a critical path (sharing critical path) that shares circuit elements with the critical path CPj is retrieved. When it is not j>x at step S1509 (step 1509: NO), the procedure is advanced to step S1402 shown in FIG. 14.

Figure 16:
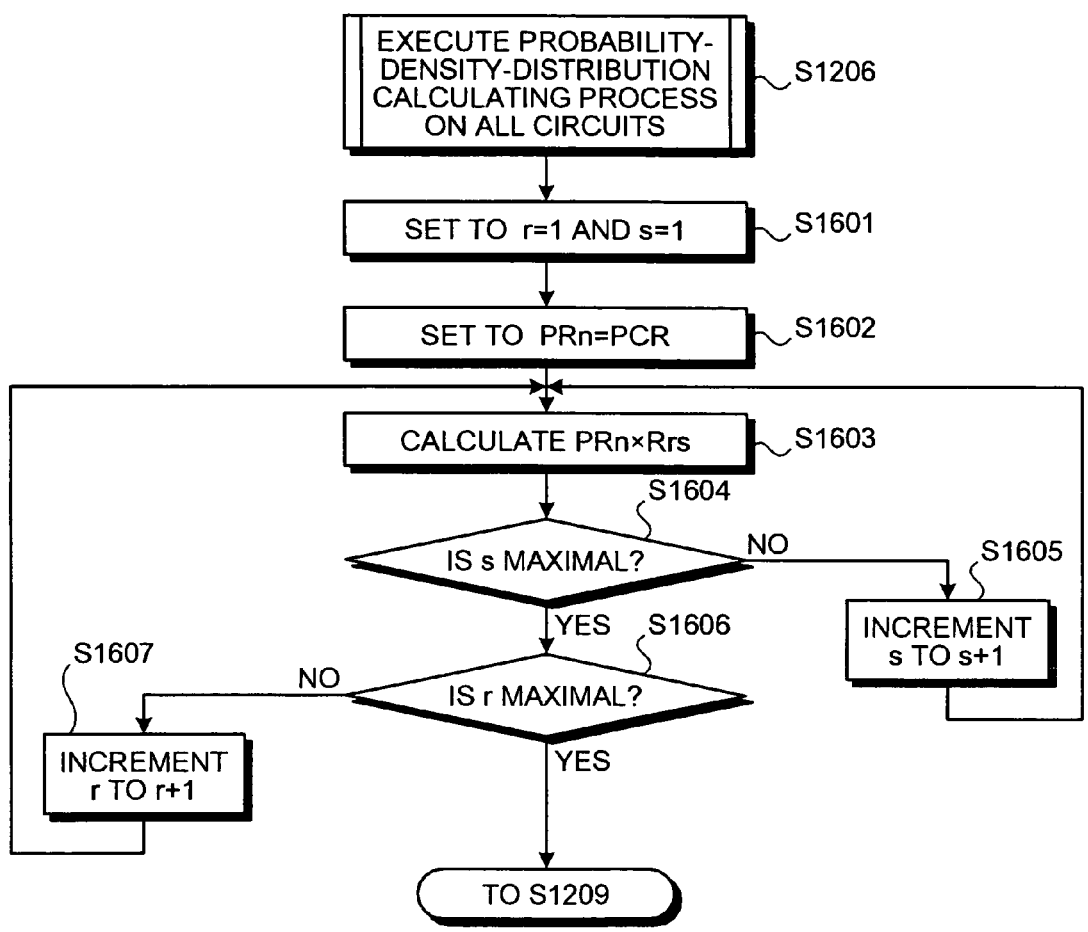
FIG. 16 is a flowchart of a probability density distribution calculating process for the entire circuit.

FIG. 16 is a flowchart of a probability density distribution calculating process for the entire circuit. Setting r=1, s=1 (step S1601), setting PRn=PCR (step S1602). PCR is the probability density distribution of a critical path described above.

An accumulated distribution product of PRn and Rrs (PRn×Rrs) is calculated (step S1603) where n is the number of times of calculation according to the accumulated distribution product. Whether s is the maximum is judged (step S1604). The maximum of s is the number of paths having a predetermined average delay value. When s is not the maximum (step S1604: NO), s is incremented (step S1605), and returning to step S1603, the accumulated distribution product is calculated. When s is the maximum at step S1604 (step S1604: YES), whether r is the maximum is judged (step S1606).

When r is not the maximum (step S1606: NO), r is incremented (step S1607) and, returning to step S1603, the accumulated distribution product is calculated. When r is the maximum at step S1607 (step S1606: YES), the procedure is advance to step S1209 shown in FIG. 12.

As described above, according to the embodiment of the present invention, the probability density distribution of all the paths in the target circuit can be calculated from the average delay value of the critical paths. From the calculated probability density distribution of all the paths, the statistic delay value of all the paths can be calculated. Therefore, the precision of the calculated statistical delay value can be improved.

As described above, according to the delay analyzing program, the recording medium recorded with the program, the delay analyzing method, and the delay analyzing apparatus, the load on the design engineers and the time period for designing can be reduced by efficiently and accurately executing the circuit delay of an analysis target circuit.

The delay analyzing method described in the embodiment can be realized by executing a program prepared in advance on a computer such as a personal computer and a work station. The program is recorded on a computer-readable recording medium such as an HD, an FD, a CD-ROM, an MO, and a DVD, and is executed by being read from the recording medium by the computer. This program may be a transmission medium distributable through a network such as the Internet.

According to the embodiments described above, it is possible to reduce a load on designing engineers and design period of a circuit.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A computer-readable recording medium that stores therein a delay analyzing program making a computer execute:

receiving a result of timing analysis of a target circuit;

detecting, from paths in the target circuit, critical paths of which a delay value is within a predetermined range based on the result of the timing analysis;

calculating an average delay distribution of paths other than the critical paths based on an average delay value of each of the critical paths;

calculating a probability density distribution of the critical paths based on a probability density distribution of delay of each circuit element constituting the critical paths;

calculating a probability density distribution of all of the paths based on the probability density distribution of the critical paths and the average delay distribution;

calculating difference between a statistical delay value of the critical paths and a statistical delay value of all of the paths based on the probability density distribution of the critical paths and the probability density distribution of all of the paths; and displaying the calculated difference on a display unit.

2. The computer-readable recording medium according to claim 1, wherein the delay analyzing program further makes the computer execute calculating a probability density distribution of the paths other than the critical paths based on the average delay distribution, and the calculating a probability density distribution of all of the paths includes calculating the probability density distribution of all of the paths based on the probability density distribution of the critical path and the probability density distribution of the paths other than the critical paths.

3. The computer-readable recording medium according to claim 1, wherein the delay analyzing program further makes the computer execute correcting the statistical delay value of the critical paths based on the difference.

4. The computer-readable recording medium according to claim 3, wherein the delay analyzing program further makes the computer execute judging whether the difference is equal to or smaller than a threshold, and the correcting includes correcting the probability delay value of the critical paths based on an error when it is judged that the difference is not equal to or smaller than the threshold at the judging.

5. The computer-readable recording medium according to claim 1, wherein the delay analyzing program further makes the computer execute:

identifying a valid path being a path of which the average delay value is equal to or larger than a reference value among the paths other than the critical paths, based on the average delay distribution of the paths other than the critical paths and the probability density distribution of the critical paths;

extracting the probability density distribution of the valid path from the probability density distribution of all of the paths; and calculating difference between the statistical delay value of the critical paths and a statistical delay value of the valid path based on the probability density distribution of the critical path and the probability density distribution of the valid path.

6. The computer-readable recording medium according to claim 5, wherein the delay analyzing program further makes the computer execute judging whether the difference is equal to or smaller than a threshold, and the identifying includes identifying the valid path when it is judged that the difference is not equal to or smaller than the threshold at the judging.

7. The computer-readable recording medium according to claim 1, wherein the delay analyzing program further makes the computer execute displaying on a display screen information on a path of which the average delay value is equal to or larger than a reference value among the paths other than the critical paths, based on the average delay distribution of the paths other than the critical paths and the probability density distribution of the critical paths.

8. A delay analyzing method comprising:
receiving a result of timing analysis of a target circuit;
detecting, from paths in the target circuit, critical paths of which a delay value is within a predetermined range based on the result of the timing analysis;
calculating an average delay distribution of the paths other than the critical paths based on an average delay value of each of the critical paths;
calculating a probability density distribution of the critical paths based on a probability density distribution of delay of each circuit element constituting the critical paths;
calculating a probability density distribution of all of the paths included in the target circuit based on the probability density distribution of the critical paths and the average delay distribution;
calculating difference between a statistical delay value of the critical paths and a statistical delay value of all of the paths based on the probability density distribution of the critical paths and the probability density distribution of all of the paths; and
displaying the calculated difference on a display unit.

9. The delay analyzing method according to claim 8, further comprising calculating a probability density distribution of the paths other than the critical paths based on the average delay distribution, wherein the calculating a probability density distribution of all of the paths includes calculating the probability density distribution of all of the paths based on the probability density distribution of the critical path and the probability density distribution of the paths other than the critical paths.

10. The delay analyzing method according to claim 8, further comprising correcting the statistical delay value of the critical paths based on the difference.

11. The delay analyzing method according to claim 10, further comprising judging whether the difference is equal to or smaller than a threshold, wherein the correcting includes correcting the probability delay value of the critical paths based on an error when it is judged that the difference is not equal to or smaller than the threshold at the judging.

12. The delay analyzing method according to claim 8, further comprising:

identifying a valid path being a path of which the average delay value is equal to or larger than a reference value among the paths other than the critical paths, based on the average delay distribution of the paths other than the critical paths and the probability density distribution of the critical paths;

extracting the probability density distribution of the valid path from the probability density distribution of all of the paths; and calculating difference between the statistical delay value of the critical paths and a statistical delay value of the valid path based on the probability density distribution of the critical path and the probability density distribution of the valid path.

13. The delay analyzing method according to claim 12, further comprising judging whether the difference is equal to or smaller than a threshold, wherein the identifying includes identifying the valid path when it is judged that the difference is not equal to or smaller than the threshold at the judging.

14. A delay analyzing apparatus comprising:
a receiving unit configured to receive a result of timing analysis of a target circuit;
a detecting unit configured to detect, from paths in the target circuit, critical paths of which a delay value is within a predetermined range based on the result of the timing analysis;
a first calculating unit configured to calculate an average delay distribution of the paths other than the critical paths based on an average delay value of each of the critical paths;
a second calculating unit configured to calculate a probability density distribution of the critical paths based on a probability density distribution of delay of each circuit element constituting the critical paths;
a third calculating unit configured to calculate a probability density distribution of all of the paths included in the target circuit based on the probability density distribution of the critical paths and the average delay distribution;
a fourth calculating unit configured to calculate difference between a statistical delay value of the critical paths and a statistical delay value of all of the paths based on the probability density distribution of the critical paths and the probability density distribution of all of the paths;
a display unit configured to display the calculated difference; and
a processor controlling the receiving unit, the detecting unit, the first calculating unit, the second calculating unit, the third calculating unit, the fourth calculating unit, and the display unit.

15. The delay analyzing apparatus according to claim 14, further comprising a fifth calculating unit configured to calculate a probability density distribution of the paths other than the critical paths based on the average delay distribution, and the third calculating unit calculates the probability density distribution of all of the paths based on the probability density distribution of the critical path and the probability density distribution of the paths other than the critical paths.

16. The delay analyzing apparatus according to claim 14, further comprising a correcting unit configured to correct the statistical delay value of the critical paths based on the difference.

17. The delay analyzing apparatus according to claim 16, further comprising a first judging unit configured to judge whether the difference is equal to or smaller than a threshold, wherein the correcting unit corrects the probability delay value of the critical paths based on an error when it is judged that the difference is not equal to or smaller than the threshold by the first judging unit.

18. The delay analyzing apparatus according to claim 14, further comprising:

an identifying unit configured to identify a valid path being a path of which the average delay value is equal to or larger than a reference value among the paths other than the critical paths, based on the average delay distribution of the paths other than the critical paths and the probability density distribution of the critical paths;

an extracting unit configured to extract the probability density distribution of the valid path from the probability density distribution of all of the paths; and a sixth calculating unit configured to calculate difference between the statistical delay value of the critical paths and a statistical delay value of the valid path based on the probability density distribution of the critical path and the probability density distribution of the valid path.

19. The delay analyzing apparatus according to claim 18, further comprising a second judging unit configured to judge whether the difference is equal to or smaller than a threshold, wherein the identifying unit identifies the valid path when it is judged that the difference is not equal to or smaller than the threshold by the second judging unit.

20. The delay analyzing method according to claim 8, wherein the steps are performed using a delay analyzing apparatus including at least a central processing unit, a read-only memory and a random access memory.

\* \* \* \* \*